United States Patent [19]
Robinson et al.

[11] Patent Number: 5,444,285
[45] Date of Patent: Aug. 22, 1995

[54] COMPLEMENTARY BIPOLAR POLYSILICON EMITTER DEVICES

[75] Inventors: Derek W. Robinson, Andover; William A. Krieger, North Andover, both of Mass.; Andre M. Martinez, Derry, N.H.; Marion R. McDevitt, Somerville, Mass.

[73] Assignee: Analog Devices, Inc., Norwood, Mass.

[21] Appl. No.: 337,148

[22] Filed: Nov. 9, 1994

Related U.S. Application Data

[60] Continuation of Ser. No. 120,137, Sep. 10, 1993, abandoned, which is a continuation of Ser. No. 991,217, Dec. 15, 1992, abandoned, which is a division of Ser. No. 828,745, Jan. 31, 1992, abandoned.

[51] Int. Cl.6 .................. H01L 29/04; H01L 21/44
[52] U.S. Cl. ............................. 257/378; 257/384; 257/518; 257/588; 257/592; 257/755; 437/186; 437/193; 437/233
[58] Field of Search ............... 257/518, 588, 592, 755, 257/378, 384; 437/186, 193, 233

[56] References Cited

U.S. PATENT DOCUMENTS

| | | | |
|---|---|---|---|
| 4,280,272 | 7/1981 | Egawa et al. | 29/571 |
| 4,295,266 | 10/1981 | Hsu | 29/571 |
| 4,295,897 | 10/1981 | Tubbs et al. | 148/1.5 |
| 4,319,395 | 3/1982 | Lund et al. | 29/571 |
| 4,345,366 | 8/1982 | Brower | 29/571 |
| 4,382,827 | 5/1983 | Romano-Moran et al. | 148/1.5 |
| 4,385,947 | 5/1983 | Halfacre et al. | 148/187 |
| 4,497,107 | 2/1985 | Cogan | . |
| 4,534,806 | 8/1985 | Magdo | 148/1.5 |
| 4,584,763 | 4/1986 | Jambotkar et al. | 29/578 |
| 4,719,185 | 1/1988 | Goth | 437/31 |
| 4,727,046 | 2/1988 | Tuntasood et al. | 437/54 |
| 4,839,305 | 6/1989 | Brighton | . |
| 4,868,135 | 9/1989 | Ogura | 257/518 |
| 4,914,048 | 4/1990 | Scovell et al. | 437/33 |
| 4,918,026 | 4/1990 | Kosiak et al. | 437/33 |
| 4,927,776 | 5/1990 | Soejima | 437/33 |
| 4,954,456 | 9/1990 | Kim et al. | 437/31 |
| 4,956,689 | 9/1990 | Yuan et al. | 357/34 |
| 4,972,243 | 11/1990 | Sugawa et al. | 357/30 |
| 4,992,848 | 2/1991 | Chin et al. | 257/518 |
| 5,008,210 | 4/1991 | Chiang et al. | . |

OTHER PUBLICATIONS

Drowley, Kapoor et al., "Stripe—A High-Speed VLSI Bipolar Technology Featuring Self-Aligned Single-Poly Base and Submicron Emitter Contacts", Hewlett-Packard Company, Palo Alto, Calif. 94304, 1990 Symposium on VLSI Technology, 1990 IEEE, pp. 53-54.

D. deLang, E. Bladt et al., "Integration of Vertical PNP Transistors in a Double-Polysilicon Bi-CMOS Process", Phillips Research Laboratories, P.O. Box 80.000, 5600 JA Eindhoven, The Netherlands, 1989 IEEE, pp. 190-193.

(List continued on next page.)

*Primary Examiner*—Edward Wojciechowicz
*Attorney, Agent, or Firm*—Wolf, Greenfield & Sacks

[57] ABSTRACT

Bipolar transistors and MOS transistors on a single semiconductor substrate involves depositing a single layer of polysilicon on a substrate, including complementary transistors of either or both types, and a method for fabricating same. The devices are made by depositing a single layer of polysilicon on a substrate and etching narrow slots in the form of rings around every bipolar emitter area, which slots are thereafter filled with an insulating oxide. Then, emitters and extrinsic base regions are formed. The emitters are self-aligned to the extrinsic base regions. An optional cladding procedure produces a surface layer of a silicide compound, a low resistance conductor. The resulting structure yields a high-performance device in which the size constraints are at a minimum and contact regions may be made at the top surface of the device.

17 Claims, 7 Drawing Sheets

OTHER PUBLICATIONS

A. Feygenson et al., "CBIC-V, A New Very High Speed Complementary Silicon Bipolar IC Process", AT&T Bell Labs, 2525 N. 12th Street, P.O. Box 13566, Reading, Pa. 19612-3566, 1989 IEEE, pp. 173-177.

Cheryl M. Maritan and N. Garry Tarr, "Polysilicon Emitter p-n-p Transistors", IEEE Transactions on Electron Devices, vol. 36, No. 6, Jun. 1989, pp. 1139-1144.

J. Warnock et al., "Boron-Doped Emitters for High-Performance Vertical PNP Transistors", IBM Research Division, IBM Thomas J. Watson Research Center, P.O. Box 218, Yorktown Heights, N.Y. 10598 1989 IEEE, pp. 186-189.

M. Inoue et al., "Self-Aligned Complementary Bipolar Transistors Fabricated with a Selective-Oxidation Mask", IEEE Transactions on Electron Devices, vol. ED-34, No. 10, Oct. 1987, pp. 2146-2152.

COMPLEMENTARY BIPOLAR POLYSILICON EMITTER DEVICES

This application is a file wrapper continuation application of application Ser. No. 08/120,137, filed Sep. 10, 1993 now abandoned, which is a continuation of Ser. No. 07/991,217, filed Dec. 15, 1992 which is a division of Ser. No. 07/828,745 filed Jan. 31, 1992.

FIELD OF THE INVENTION

The present invention relates to a method of fabricating complementary bipolar and CMOS semiconductor devices, and more specifically to a method of fabricating such devices with a single polysilicon layer and self-aligned emitters, and to the resulting devices.

BACKGROUND OF THE INVENTION

It has become increasingly desirable in the field of semiconductor device technology to provide bipolar and CMOS transistors on a single semiconductor substrate. Such a dual construction can provide high performance (better than CMOS transistors alone) without high power consumption (much lower than bipolar transistors alone). Similarly, it has become increasingly desirable to provide complementary NPN and PNP transistor pairs on a single semiconductor substrate because of the low power consumption of such a construction (lower than non-complementary construction).

As such, many efforts have been directed at producing bipolar and CMOS transistors on a single semiconductor substrate. Additionally, many efforts have been directed at producing complementary bipolar transistor pairs on a single semiconductor substrate. Generally, complementary bipolar transistor fabrication has included multiple polysilicon layers. This has created two main problems. First, the fabrication is expensive due to the multiple polysilicon layers utilized. Second, and for the same reason, the process cannot easily be integrated to include CMOS transistors. Bipolar transistor (with or without CMOS) fabrication has included the process of photolithographically defining emitters and extrinsic bases, which process produces non-self-aligned emitters. Consequently, due to equipment inaccuracies, or alignment tolerances between layers, the relative locations of the non-self-aligned emitters and extrinsic bases cannot be precisely defined. To compensate for such reduced precision (non-self-alignment) the distance between the emitters and extrinsic bases must be made sufficiently large as to prevent physical overlap. A lower performance device results from this design sizing requirement.

In response, prior art efforts have been directed at fabricating bipolar transistors with self-aligned emitters. One such bipolar transistor fabrication process, aimed at producing self-aligned emitters, utilizes multiple polysilicon layers and oxide layers to define emitters and extrinsic bases. The process includes defining a field oxide layer upon a substrate of silicon and thereafter defining recessed regions within the field oxide layer, one for the bipolar region, and one for the MOS region (if included). Thereafter, an intrinsic base region is formed within a recess in the bipolar region. Then a first polysilicon layer is deposited thereon with another oxide layer deposited on the polysilicon layer, and an opening is formed, for enabling subsequent formation of the emitter. Next, a further oxide layer is deposited thereon. Then a dry chemistry etching procedure is performed to remove the further oxide layer in the area where the emitter is to be performed. This leaves an insulating oxide layer on the polysilicon layer and oxide spacers on the side walls of the emitter opening. Thereafter, another polysilicon layer is deposited thereon and the emitter and extrinsic bases are formed. Such e fabrication process is disclosed in U.S. Pat. No. 4,868,135 to Ogura et al. A number of problems are associated with such a self-aligned bipolar transistor fabrication process. First, because of the dry etching procedure involved, the intrinsic base region surface can be damaged and the base width (distance between the bottom of the emitter and the bottom surface of the intrinsic base) cannot be controlled accurately. As such, low current leakage and poor parametric control may result. Second, performance is degraded when the base region is contacted above the field oxide layer due to the high resistance type polysilicon layers therebetween. In addition, due to the thin oxide layer between the two polysilicon layers, a large, unwanted base-to-collector capacitance results which is detrimental to the high speed performance. Finally, the emitter surface area must be made larger than the emitter contact area otherwise the emitter contact will overhang the emitter and short the transistor emitter and base. This emitter size constraint presents a serious drawback in terms of performance.

Accordingly, a general purpose of this invention is to provide a method of fabricating bipolar transistors and MOS transistors, including complementary transistors of either or both types, on a single semiconductor substrate with self-aligned emitters and a single polysilicon layer.

SUMMARY OF THE INVENTION

The aforementioned problems and drawbacks are overcome by an inventive fabrication method and bipolar transistor structure in which an emitter is isolated in a single polysilicon layer by forming an insulating isolation ring around the emitter.

More particularly, according to the invention, a bipolar intrinsic base region is defined in an epitaxial silicon layer below a previously formed defined opening (or "recessed region") in a field oxide layer. Then, a single polysilicon layer is deposited thereon and narrow slots are etched in the form of rings (referred to as "isolation rings") in such polysilicon layer, around every emitter. These isolation rings are thereafter filled with an insulating oxide. Then, N-type and P-type doping is independently carried out, in a conventional manner, to form emitters and extrinsic bases for the bipolar devices. In addition, the thermal drive cycles for causing diffusion of the N-type and P-type dopants are carried out independently, in succession and may be independently controlled for optimization. Because the conventional N-type and P-type doping only affects silicon and not the insulating oxide, which fills the isolation rings, the emitters are self-aligned and less sensitive to the mechanical tolerances described above with respect to non-self-aligned processes. The single polysilicon layer allows for CMOS transistor fabrication and integration during the same steps which produce the bipolar transistors.

In an alternate embodiment of the present invention, a silicide cladding layer is formed on all surface polysilicon areas to reduce contact resistance and reduce the parasitic series resistance which otherwise would be introduced by effecting transistor base contacts via such polysilicon areas.

In a further alternate embodiment, the slots within the polysilicon layer are etched through the polysilicon layer and into the intrinsic base region to reduce emitter side wall capacitance. This embodiment may include the further step of doping the intrinsic base region, in a conventional manner, in the areas below the etched slots, in order to reduce the extrinsic base resistance caused by such deep etching.

Other advantages, novel features and objects of the invention will become apparent from the following detailed description of the invention when considered in conjunction with the accompanying drawings.

DETAILED DESCRIPTION

Figure 1:
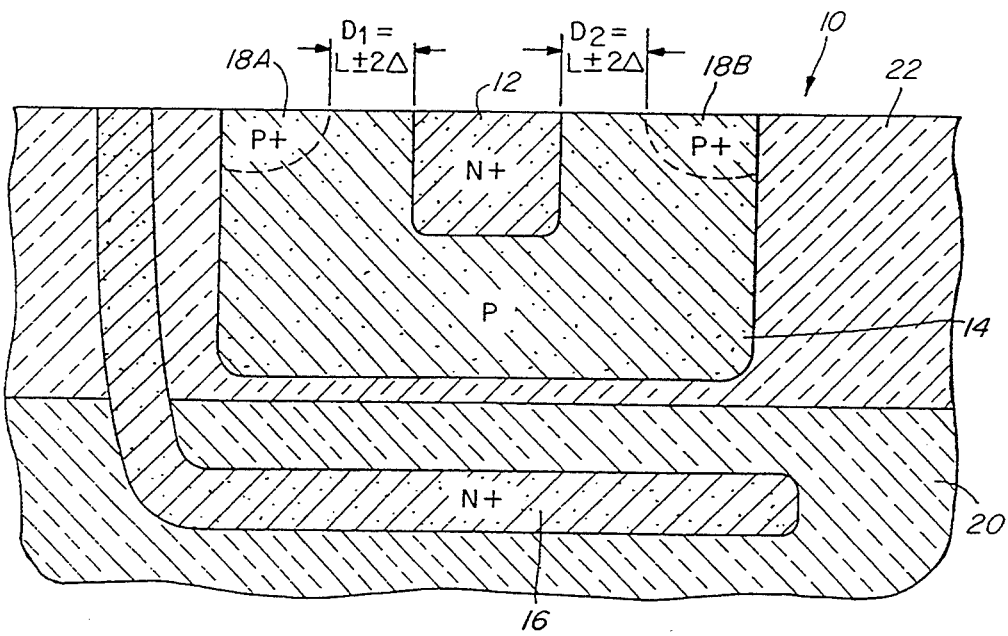
FIG. 1 is a cross-sectional view of a prior art non-self-aligned bipolar transistor illustrating the fabrication process thereof.

Referring now to FIG. 1, a cross-sectional view of a prior art non-self-aligned bipolar transistor 10 is illustrated. The illustrated device 10 is an NPN device with an N+ emitter 12, a P-type intrinsic base region 14, an N+ collector 16, and P+ type extrinsic bases 18A and 18B. During the fabrication of such a non-self-aligned transistor, the buried collector 16 is initially formed in the substrate silicon 20. Then, the epitaxial silicon layer 22 is grown thereon and the intrinsic base region 14 is conventionally formed, photolithographically (with a photoresist mask and P-type doping) in the epitaxial silicon layer 22. After the formation of the intrinsic base region 14, the emitter 12 and extrinsic bases 18 are similarly formed photolithographically with N-type and P-type doping respectively. During the formation of the intrinsic base region 14, the emitter 12 and the extrinsic bases 18, photoresist layers are used to produce an oxide mask which selectively inhibits the diffusion of the doped impurities. The locations of these regions cannot be precisely defined due to inherent inaccuracies in the photolithographic equipment used. As a result, the distance $D_1$ and $D_2$ between the extrinsic bases 18A and 18B, respectively and the emitter 12 may differ from the nominally intended dimension, L, by an inaccuracy of $\pm 2\Delta$, where $\Delta$ represents the inaccuracy in location of each defined region (i.e., an extrinsic base or an emitter, considered as a single element). To compensate for such inaccuracy, nominal distance L must be made large enough so that there will be no overlap between the extrinsic bases 18A, 18B and the emitter 12, i.e., $D_1$ and $D_2$ will always be greater than zero. This size constraint presents a serious drawback in that a lower yield device results (from its relatively large size); that is, the number of devices per unit area is limited and the number of good "chips" per die is lowered.

Figure 2:
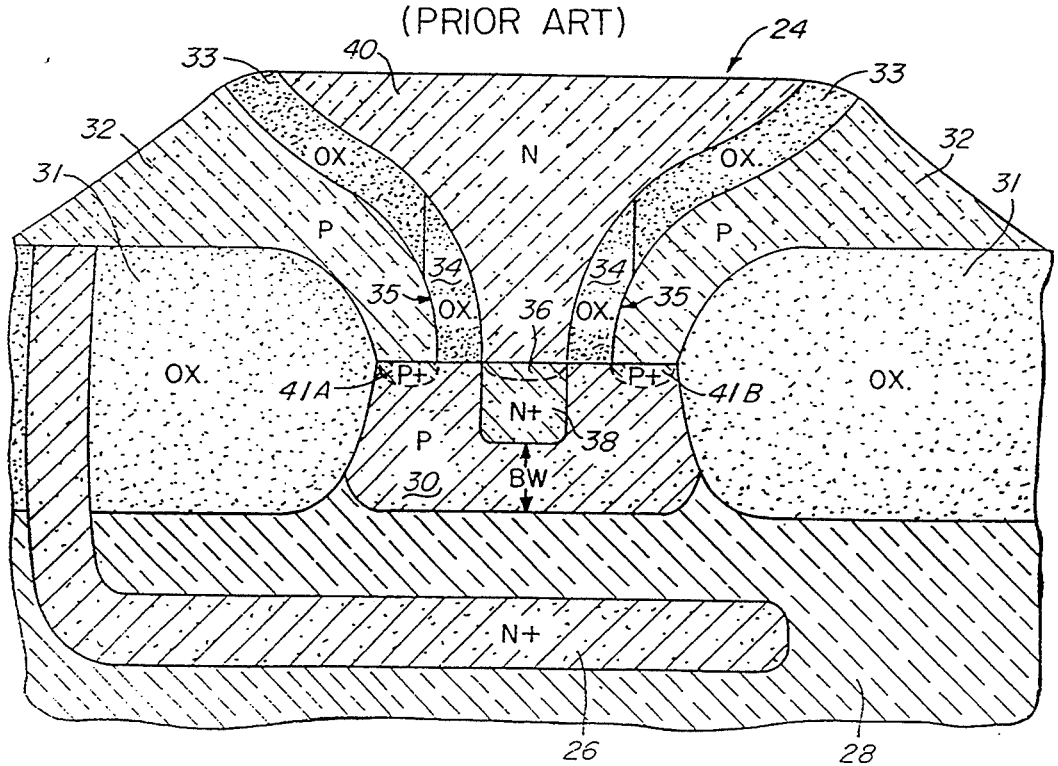
FIG. 2 is a cross-sectional view of a prior art self-aligned bipolar transistor illustrating the fabrication process thereof.

Referring now to FIG. 2, a cross-sectional view of a prior art self-aligned bipolar transistor 24 is illustrated. During fabrication of such a prior art self-aligned bipolar transistor 24, after formation of any buried layers (illustrated in FIG. 2 with an N+ collector 26) within the silicon substrate 28, and formation of an epitaxial layer of silicon thereon, the intrinsic base region 30 is formed within a defined opening (or "recess") in a field oxide layer 31. Thereafter, any residue oxide left over from the formation of the intrinsic base region 30 is removed. Then, a first polysilicon layer 32 is deposited thereon, and coated with another layer of oxide 34. Thereafter, an opening is etched into the oxide 34 and first polysilicon layers, the opening being larger than the size of the emitter to be formed, for enabling subsequent formation of the emitter. Then, further oxide layer 33 is deposited thereon. A plasma or dry chemistry etching procedure is then performed to remove the oxide at the bottom of the rectangular opening leaving a layer of polysilicon remaining on the top surface of the polysilicon 32, and small fillets of oxide 34 remaining on the sidewalls of the polysilicon 35. This dry etching procedure includes a bombardment process which may damage the surface of the intrinsic base region above where the emitter is to be formed. If damage to this surface occurs as illustrated in FIG. 2 by region 36, the emitter 38 will be formed at a location within the intrinsic base 30 region lower than preferred. Thus, the base width BW, or distance between the bottom surface of the emitter 38 and bottom surface of the intrinsic base region 30, will be lessened. Further, with such a dry etching procedure, base width control is compromised. As a result, parametric variability may occur (which accompanies variable base width). After the etching procedure is completed, another polysilicon layer 40 is deposited and the emitter 38 and extrinsic bases 42 are formed.

In addition to the performance variability, there exist other drawbacks associated with this method of fabrication. For example, degraded performance results when contact is made to the base above the field oxide layer 31. This is so because the polysilicon layer 32, which connects the contact to the extrinsic base 42A or 42B, presents a relatively high resistance path for current traveling in a vertical and horizontal direction from the contact. Both vertically and horizontally traveling current must pass through the P-type polysilicon layer 32, which for an NPN type transistor 24 has a significant resistance contribution. It would be very difficult to clad the surface of the polysilicon layers with a silicide compound to reduce series resistance because of the overlap of the multiple polysilicon layers. In addition, due to the thin oxide layer 34 between polysilicon layers 32 and 40, a large unwanted base-to-collector capacitance results. This, of course, negatively affects high-speed performance. Additionally, the surface of polysilicon 40 must be made larger than the size of the emitter contact to it otherwise the emitter-contact cannot overhang the emitter or it may contact the extrinsic base and short circuit the device. This large emitter size requirement likewise negatively affects the performance of the device.

Unlike the above-described prior art methods of fabrication, the present invention provides complementary bipolar and complementary MOS transistors on a common semiconductor substrate wherein the bipolar transistors have self-aligned emitter to extrinsic base structure, and base width control, good low current performance, relatively small extrinsic bases and emitters, it allows for contacting the base above the field oxide layer and for emitter contact overhang. An alternate embodiment of the present invention offers reduced emitter sidewall capacitance.

This invention involves etching thin slots in the form of a ring around every emitter in a single polysilicon layer, and filling such isolation rings with an insulating oxide material. Self-aligned emitters and extrinsic bases are then formed with separate P-type and N-type doping cycles, which are controlled independently for optimization. The insulating isolation rings provide well defined insulating boundaries to form the self-aligned-emitters-to-extrinsic-base structure.

The method of fabrication of the present invention is described below. The description and figures, for example purposes only, refer to an NPN and NMOS device. It is to be appreciated, however, that the same method of fabrication, with very slight variations which will be apparent to those skilled in the art, can produce a PNP bipolar device and other MOSFET devices additionally or alternatively.

Figure 3:
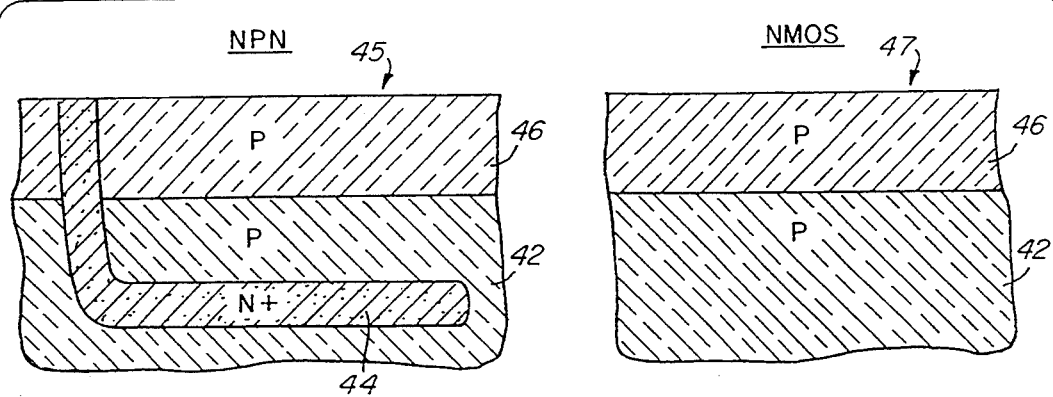
FIGS. 3–8 and 10–13 are cross-sectional views illustrating the fabrication sequence of the bipolar and CMOS device of the present invention.

Referring in particular to FIG. 3, starting with a P-type semiconductor monocrystal, polished silicon substrate 42, a heavily doped N+ subcollector (i.e., buried collector) 44, is formed by N-type (e.g., arsenic, antimony, or phosphorous) ion implantation (doping). Then, an epitaxial layer 46 is grown over both the regions to be used for bipolar devices. In FIG. 3, for example, an NPN device will be formed in region 45 on the left and an NMOS device will be formed in region 47 on the right. Typically, a reduced pressure is used during the growth of epitaxial layer 46 to avoid excessive autodoping. The thickness of the epitaxial layer 46 is selectable according to the desired amount of vertical separation between base and subcollector of the NPN devices and the desired vertical dimension of the PNP collectors. For a given NPN emitter-base profile, as the thickness of the epitaxial layer 46 is increased, the vertical spacing between the NPN base and subcollector will correspondingly increase, which will increase the breakdown voltage of the device but reduce high speed performance. The preferred thickness of the epitaxial layer typically may be about 2.5–3 micrometers (for a 12 volt device) with boron P-type doping concentration of about $1 \times 10_{15}$ atoms/cc.

Figure 4:
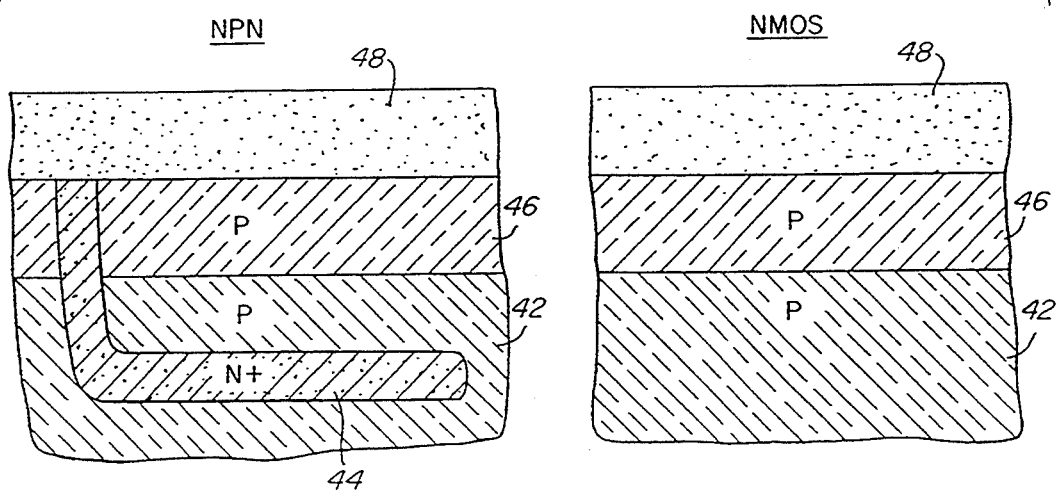
Figure 5:
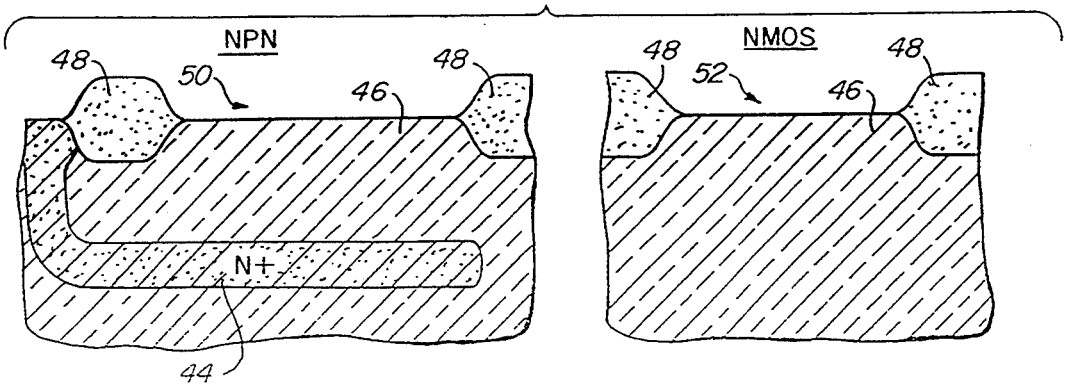

Referring now to FIG. 4, the surface of layer 46 is oxidized to grow field oxide layer 48; the field oxide layer may, for example, be about 6000 angstroms thick. During this oxidation, two recessed regions are formed in the field oxide layer, one recessed region 50 in the bipolar transistor area, above where the intrinsic base region will be formed, and another recessed region 52 in the MOS transistor area. This step results in defined recessed regions 50 and 52 which reach through to the silicon epitaxial layer 46 and are surrounded on both sides by thick field oxide layer 48, as iilustrated in FIG. 5.

Figure 6:
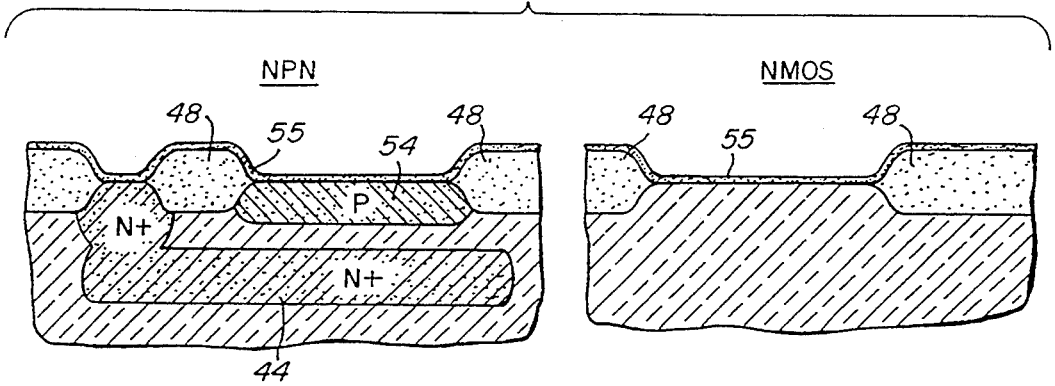
Figure 7:
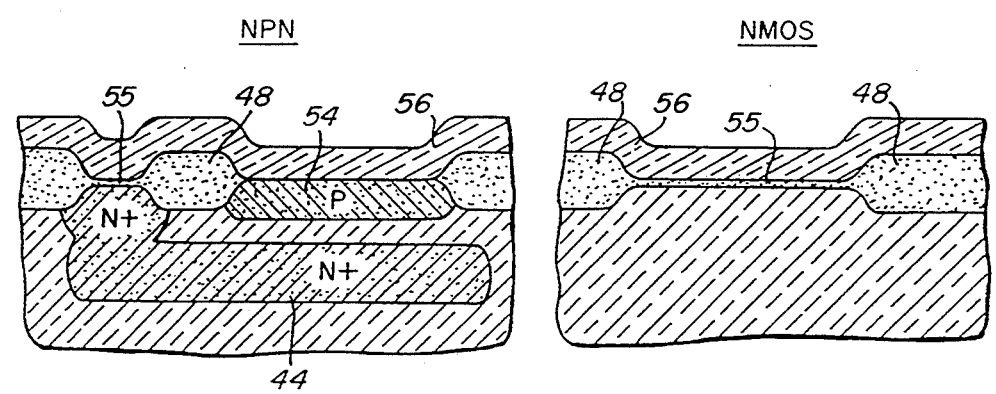

Turning to FIG. 6, the next step involves the formation of the intrinsic base region 54 in the bipolar NPN transistor area. The intrinsic base region 54 is formed conventionally in the epitaxial layer below the NPN recessed region with P-type doping. The next step includes growing a gate oxide layer 55 over both the NPN and NMOS areas. After growth of the gate oxide layer, the gate oxide layer is selectively removed from the surface of the intrinsic base region 54 through a wet etch procedure, leaving only the thin layer of gate oxide 55 remaining over the recessed region in the NMOS device and preferably over the collector 55, as illustrated in FIG. 7. A preferred wet etch procedure involves exposing only the region of the gate oxide layer to be removed, with use of a photoresist mask, to a weak hydroflouric acid reactant. The hydroflouric acid serves to etch away the gate oxide layer but will not react with the silicon of the intrinsic base region. In contrast with the prior art dry etch procedure, this wet etch procedure serves to remove the gate oxide layer without damaging the surface of the intrinsic base region, where the emitter is thereafter defined and formed. The resulting structure is illustrated in FIG. 7.

As also illustrated FIG. 7, in contrast with the prior art, the next step in the-method involves depositing a single layer of undoped polysilicon 56 on the structure. Layer 56 provides the basis for formation of the bipolar emitter, extrinsic bases, and NMOS gate. This undoped polysilicon layer 56 is deposited conventionally. A typical thickness for such polysilicon layer 56 is within the range of 2000–5000 Angstron units.

A variant of this processing step includes the use of a two stage polysilicon deposition sequence (as previously reported in the literature). In this procedure, the polysilicon layer is deposited in a two stage operation. Initially, a thin layer of polysilicon is deposited immediately after the gate oxide is grown. Conventional photolithographic steps selectively open the intrinsic base regions, by locally removing the polysilicon and the underlying gate oxide. Polysilicon is then redeposited, to the thickness desired for bipolar device and MOS gate formation. The benefit of this additional processing is that the high purity gate oxide is protected from direct contact with photoresist (and its contained impurities) by the thin polysilicon layer.

Figure 8:
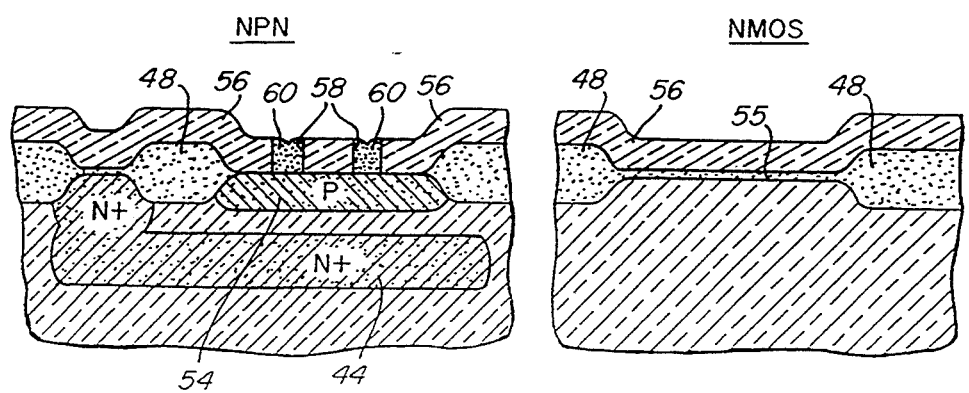
Figure 9:
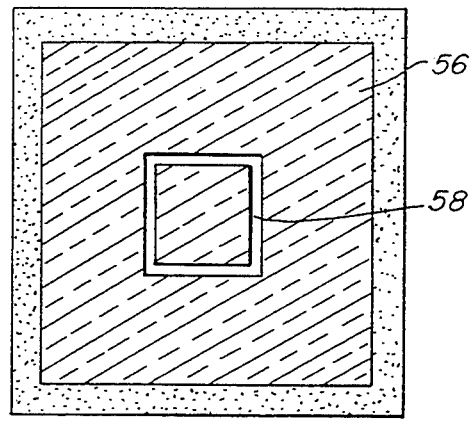
FIG. 9 is a top-down view illustrating the bipolar-device of the present invention at a particular stage during the fabrication sequence thereof.

The next step (See FIG. 8.) is a photolithographic step in which a photoresist mask is used to define and etch narrow slots 58 in the form of rings around every prospective emitter area in the polysilicon layer. The slots 58 are made as narrow as the photolithography tools allow. It is envisioned that these slots may be defined by non-photolithographic means. The slots 58 are then filled with a suitable dielectric, or insulating oxide 60, as illustrated in FIG. 8. Thereafter, the insulating oxide 60 is etched back flush with the surface of the polysilicon. These isolation rings are used to define the boundary of the emitters. Referring to FIG. 9, a top-down view is shown of the structure after these slots have been etched; note that although a square device is shown, it could be a non-square rectangular or other shape, as well. The isolation rings are referred to as "ring-shaped". It is to be appreciated that "ring-shaped" includes but is not limited to round, square and rectangular shapes.

Figure 10:
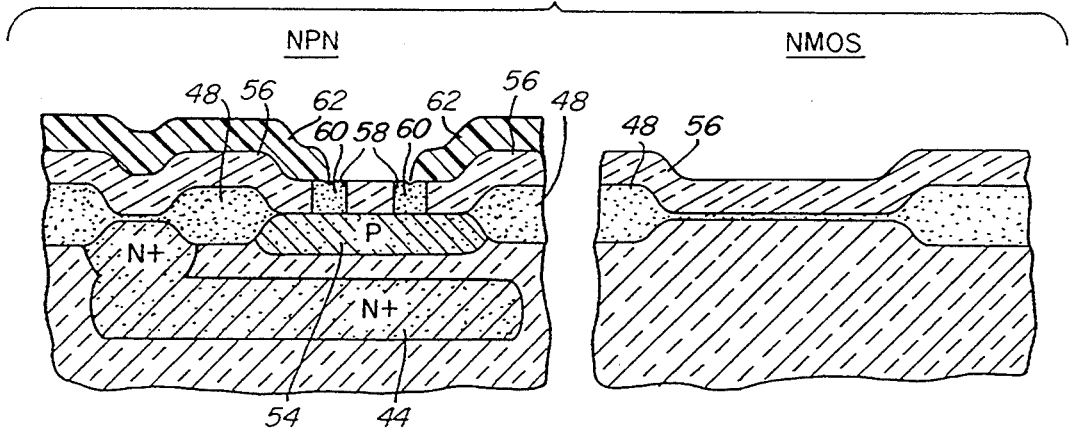
Figure 11:
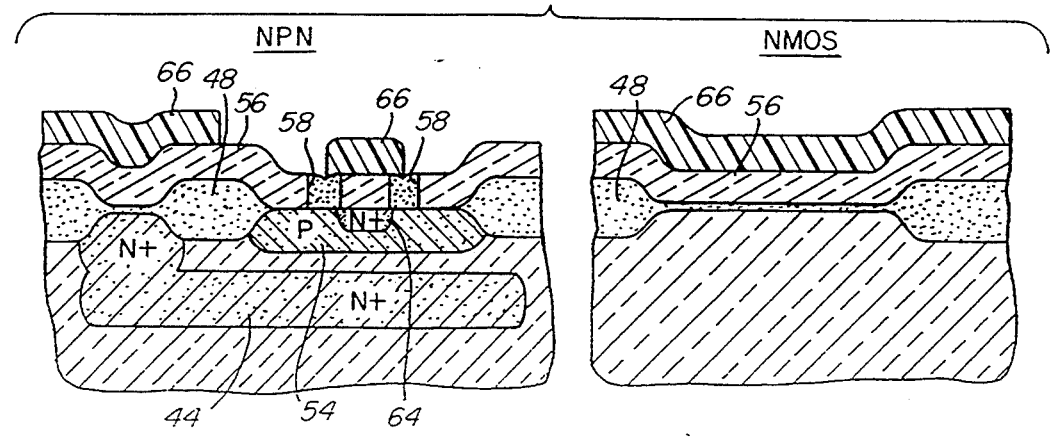

A photoresist mask 62 is then used to define regions of polysilicon for implementation with an N-type dopant, as illustrated in FIG. 10. This N-type dopant is used to form the emitters for NPN devices (as illustrated), the base contacting regions (extrinsic bases) for PNP devices and the gates for the MOS devices. Next, the N-type dopant is implanted in the polysilicon layer 56. A preferred N-type dopant is arsenic, though phosphorus or antimony (or possibly other materials) may also be used. The photoresist layer 62 is then removed. The structure then undergoes a thermal drive cycle, in which the N-type dopant is driven into the epitaxial layer. A typical doping concentration is within the range of $5 \times 10^{15}$ to $5 \times 10^{16}$ ions/square cm. A typical N-type drive cycle includes subjecting the structure to a temperature of 900° C. for sixty minutes. It is to be appreciated, however, that the timing and temperature of this cycle can be altered to affect the depth of the N-type dopant. N+ emitter 64, as illustrated in FIG. 11, is "self-aligned" with respect to the extrinsic bases, which are formed thereafter. "Self-alignment" of the emitter means that when the emitter and extrinsic bases are formed, their locations are accurately predefined and the mechanical tolerances between layers, caused by the locations of the photoresist masks, do not affect the resulting locations of the emitter and extrinsic bases. Therefore, overlapping of the extrinsic bases and the emitter is not a concern and the distances between the extrinsic bases and the emitter need not be made large. This self-alignment occurs because the dopant only affects the silicon during this process, and not the insulating oxide 60 which fills the ring-shaped slots 58 surrounding the emitter 64. Thus, the ring-shaped slots 58 provide well-defined insulating boundaries for the self-aligned emitters during the thermal cycle and any misalignment of the layers is "lost" in or over the slots. As aforementioned, these ring-shaped slots 58 are as narrow as the photolithographic tools will allow, which provides for a small distance between the emitter and extrinsic bases.

Figure 12:
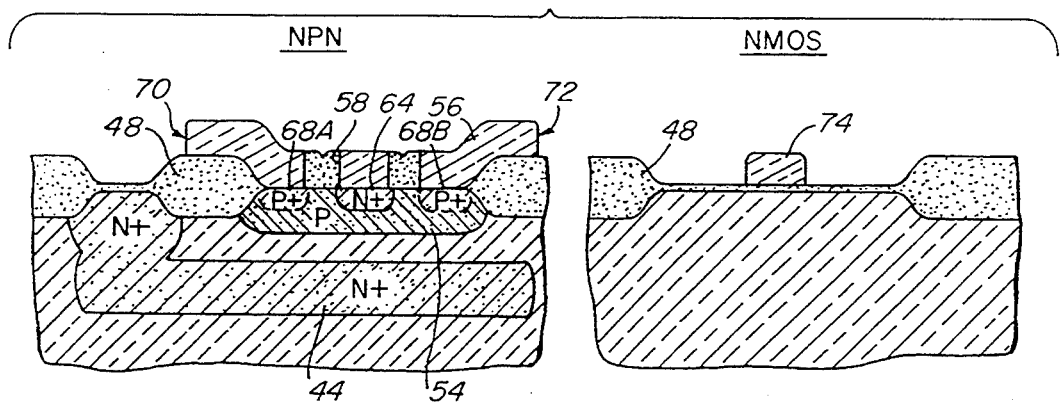

The next step involves utilizing a photoresist mask 66 to define regions of polysilicon 56 for implantation with a P-type dopant as illustrated in FIG. 11. The P-type dopant is used to define emitters for PNP devices and base contacting regions (extrinsic bases) for NPN devices. The next step involves implanting the polysilicon with the P-type dopant. A preferred P-type dopant is boron. Next, the photoresist layer 66 is removed and the structure then undergoes a thermal drive cycle in which the P-type dopant is driven into the epitaxial layer to form the extrinsic bases 68A, B. A typical doping concentration is within the range of $5 \times 10^{15}$ to $5 \times 10^{16}$ ions/sq. cm. A typical P-type thermal drive cycle involves exposing the structure to a temperature of 900° C. for thirty minutes. Note that the N-type drive cycle is distributed among two independent drive cycles, one of which occurs before the P-type implantation and one which occurs simultaneously with the P-type drive cycle. It is to be appreciated that the timing and temperature of the P-type drive cycle, which corresponds to the second portion of the N-type drive cycle, can be controlled, independently of the first portion of the N-type drive cycle, to affect the depth of the P-type dopant. The first portion of the N-type drive cycle can be adjusted to offset any adjustment in the P-type drive cycle. For example, with an increase in the length of the P-type drive cycle (second portion of N-type drive cycle), a corresponding decrease in the length of the first portion of the N-type drive cycle would yield the same N-type doping results, while effectively adjusting the P-type doping results. Thus, the thermal budgets of the heat cycles can be adjusted and proportioned to optimize the physical arrangement of the resulting structure and, therefore, the performance of the device. The overall N-type drive cycle is typically longer than the P-type drive cycle because forming N+ diffused regions from N+ polysilicon generally requires a longer heat cycle. FIG. 12 illustrates the structure after formation of the N+ emitter 64 and P+ extrinsic bases 68.

A photolithography step is then used to remove excess polysilicon from around the periphery of the bipolar devices, and to define the CMOS polysilicon gates. This step involves utilizing a photoresist mask to define the gates and areas where excess polysilicon is to be removed. A dry etch process is then utilized to remove the polysilicon. The resulting structure is illustrated in FIG. 12 wherein the sides of the polysilicon layer 56 are etched back to edges 70 and 72 in the NPN device and the gate 74 is formed in the NMOS device. It is to be appreciated that defining the gates may be performed at the same time that the emitter slots are etched, utilizing the same photoresist mask. It is preferred, however, to perform these steps independently and independently to optimize the photoresist masks for the bipolar emitter slots and the CMOS gates. Conventional processing is then used to define the NMOS source 78 and drain 80. This conventional processing includes utilizing a photoresist mask to define the regions and thereafter performing ion implantation (i.e., doping). N+ doping is performed to produce the N+ source 78 and drain 80 for the NMOS device illustrated. It is to be appreciated that the doping procedure is controlled to produce a desired NMOS device and that other types of doping may be utilized to produce other types of MOSFETS.

Figure 13:
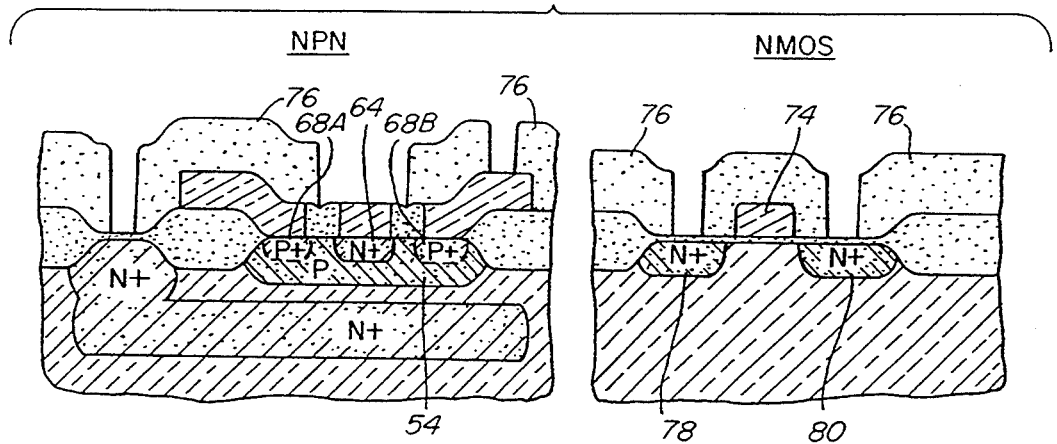

The next step involves depositing an intermediate insulating oxide layer 76, as illustrated in FIG. 13. The intermediate insulating oxide layer 76 is an insulating layer located between the polysilicon layer and any metal surface conducting layers (commonly referred to as "wiring layers"). Thereafter, contact holes are cut to emitter, base and gate polysilicon regions, and to source, drain, substrate and collector regions as shown in FIG. 13. Then, one or more metal surface conducting layers may be deposited. The resulting structure includes both CMOS and complementary bipolar transistors (NMOS and NPN illustrated) on a common semiconductor substrate. The bipolar emitters are self-aligned to the extrinsic bases. The wet etch procedure allows good base width control and good low current performance results therefrom.

In an alternate embodiment of the present invention silicidation cladding of the emitter and base contacting regions provides for reduction in the polysilicon parasitic sheet resistance, This silicidation cladding procedure involves forming a silicide compound layer over all polysilicon areas. The silicide compound is a layer which rests on the surface of all polysilicon surface areas and provides a low resistance path for any horizontally flowing current. Current flows both vertically and horizontally from surface contact areas through the high resistance polysilicon layer. The polysilicon layer has a horizontal resistance component and a vertical resistance component, the horizontal component being of much greater magnitude. The silicide compound greatly reduces the horizontal resistance component, The silicidation cladding procedure is described below.

Figure 14:
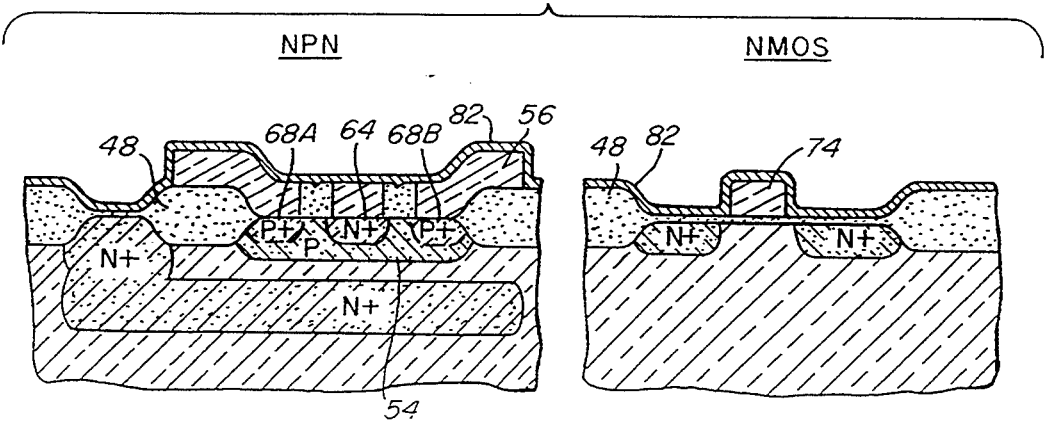
FIGS. 14–16 are cross-sectional views illustrating an alternate embodiment fabrication sequence of the bipolar and CMOS device of the present invention.
Figure 15:
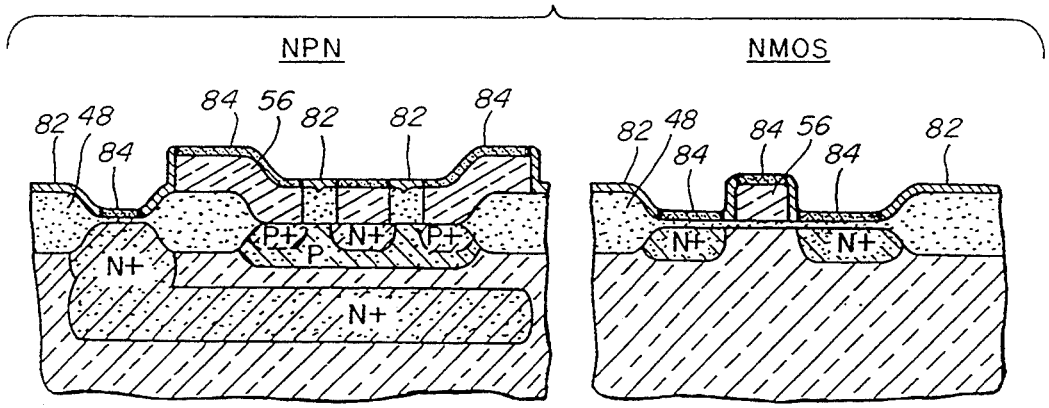
Figure 16:
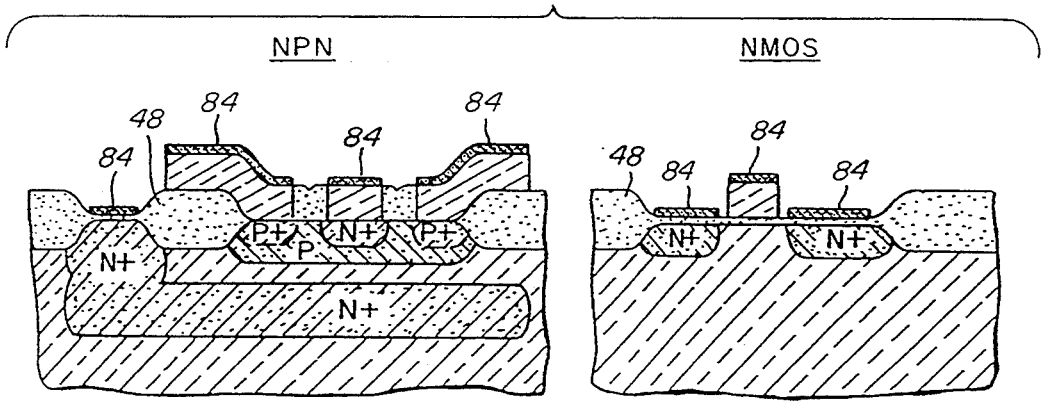

After formation of the emitter 64 and extrinsic bases 68 illustrated in FIG. 12, a metal such as tungsten 82 is deposited over the entire polysilicon and oxide 48 surface area. Other metals such as titanium, cobolt, platinum, and others may be used. The resulting structure is illustrated in FIG. 14. The entire structure is then subjected to a heat cycle of between 400° and 800° C. for several minutes. This thermal cycle causes the tungsten to react with the polysilicon and form tungsten-silicide 84 at the surface area where the tungsten is in contact with the polysilicon. Where the tungsten is in contact with insulating oxide, no reaction occurs and the tungsten remains straight tungsten 82. This is illustrated in FIG. 15. The structure is then exposed to an etchant such as hydrogen-peroxide which serves to remove the tungsten 82 from the oxide areas. The etchant does not affect the tungsten-silicide 84. Therefore, the etchant only removes the tungsten 82 and the tungsten-silicide 84 remains. The resulting structure is illustrated in FIG. 16. Tungsten-silicide 84 is a low resistance, electrically conducting compound, and each tungsten-silicide area (i.e. collector, base, emitter, source, drain and gate) is electrically isolated from the other due to the etched areas therebetween. Thereafter, metal contacts are made to the tungsten-silicide surfaces.

Figure 17:
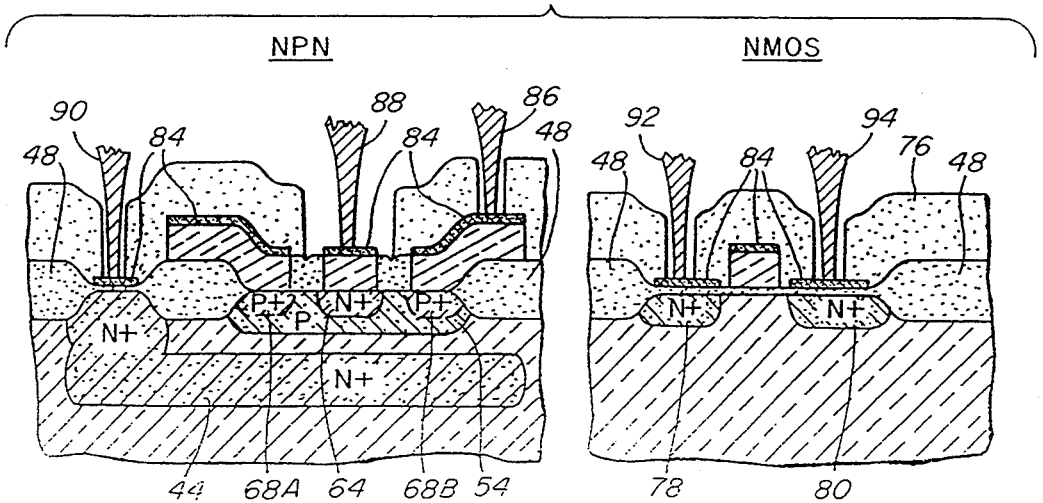
FIG. 17 is a cross-sectional view of the bipolar device of the present invention illustrating a final step in the fabrication thereof.

It is to be appreciated that the tungsten-silicide offers a low resistance path for the horizontally flowing current. Therefore, the base contact 86 can be made above the field oxide layer 48, as illustrated in FIG. 17. As illustrated, base contact 84, emitter contact 88, collector contact 90, source contact 92 and drain contact 94 are all made at the surface of the device, to the tungsten-silicide areas 84.

Figure 18:
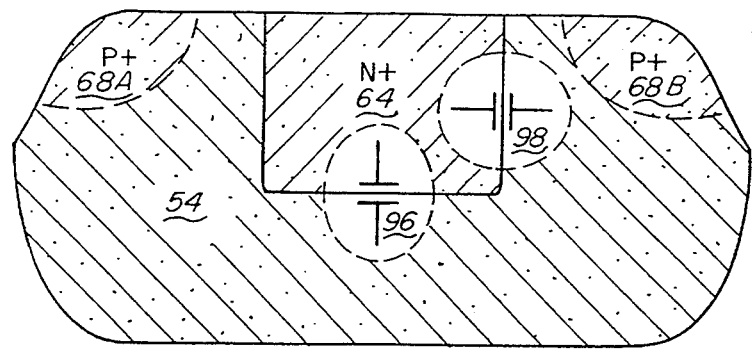
FIG. 18 is a cross-sectional view of the bipolar device of the present invention, illustrating the sidewall capacitance thereof.
Figure 19:
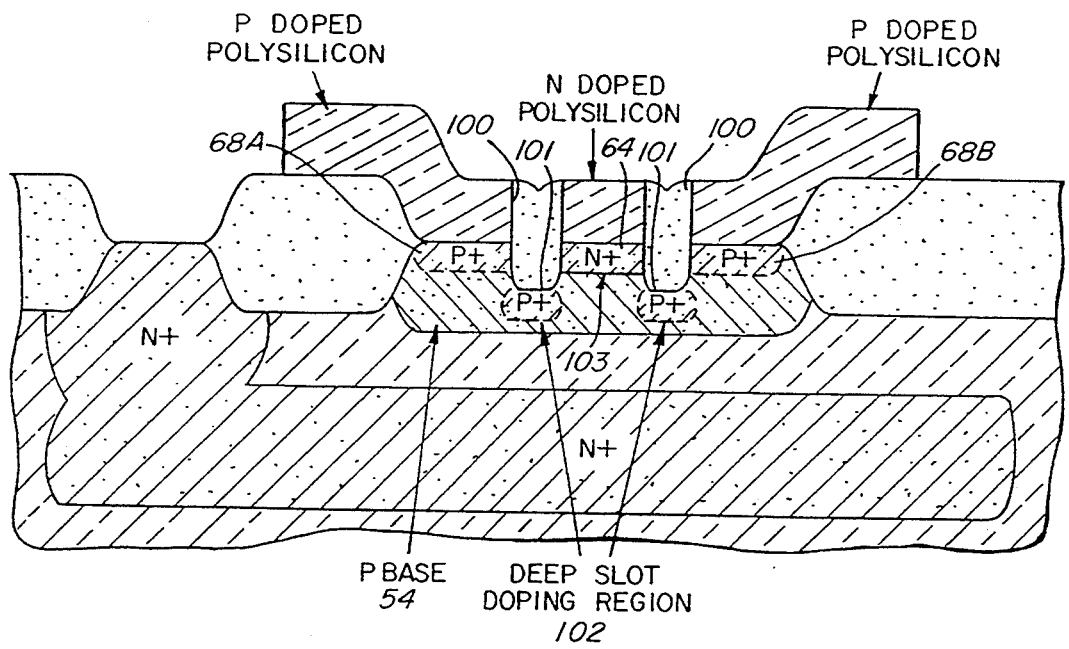
FIG. 19 is a cross-sectional view illustrating an alternate embodiment fabrication sequence of the bipolar device of the present invention.

FIG. 18 illustrates schematically that a bottom wall capacitance 96 and side wall capacitance 98 are present between the emitter 64 and its surroundings. These capacitances are unwanted and negatively affect the performance of the transistor device. The side wall capacitance 98 is greater near the top of the emitter 64. To compensate for this, and reduce the side wall capacitance, a method and structure according to an alternate embodiment of the present invention (see FIG. 19) provides for etching the slots in the polysilicon layer some distance through the polysilicon layer and into the intrinsic base region. These slots 100, which bound the emitter 64, are illustrated, according to this alternate embodiment, in FIG. 19. Note that the slot bottoms 101 are below the bottom surface 103 of the emitter 64. While the deeper etched slots 100 reduce the emitter side wall capacitance, the total base resistance is increased as well. This increase also negatively affects the performance of the device. To reduce the extrinsic base resistance, doping may be performed just below the slots 100 in deep slot doping regions 102, as illustrated in FIG. 19. This doping may be performed conventionally through photolithographic steps. P+ doping of regions 102 is appropriate in an NPN transistor, as illustrated in FIG. 19.

While the description and the figures are directed to a method of fabricating an NPN bipolar transistor and an NMOS transistor, it is to be appreciated that variations of these steps can be carried out to produce a PNP type bipolar transistor and other MOSFET devices.

Many modifications and variations of the method for implementing the present invention, and the specific device structures, are possible in light of the above teachings. All dimensions, doping concentrations, dopant and substrate materials, temperature, drive cycle durations and other specific parameters mentioned in the specification are not intended as limiting, but only are meant to be exemplary. Those skilled in the art will readily appreciate that all such parameters will depend upon the specific device characteristics being sought. It is, therefore, to be understood that the foregoing embodiments are presented by way of example only and that, within the scope of the appended claims and equivalents thereto, the invention may be practiced otherwise than as specifically described.

What is claimed is:

1. An integrated circuit structure including complementary PNP and NPN bipolar transistors of similar profile and approximately matched performance and at least one field effect (MOS) transistor adjacent the bipolar transistors on a common substrate produced by the steps of:

defining at least one buried layer within said substrate;

for each bipolar transistor, forming a bipolar transistor intrinsic base region as a buried layer within said substrate having a doping concentration different from that of the substrate;

depositing only a single layer of polysilicon on said substrate;

for each bipolar transistor, forming an insulating isolation ring within said polysilicon layer around a region where a bipolar transistor emitter is to be formed, the ring having an inside region and an outside region of polysilicon;

for each bipolar transistor, selectively forming a self-aligned bipolar transistor emitter within said substrate below the inside regions of polysilicon;

for each bipolar transistor, selectively forming an extrinsic base within said substrate below the outside region of polysilicon;

wherein the emitters and extrinsic bases of the NPN and PNP transistors are formed in two drive-in steps;

wherein an N-type emitter of the NPN transistor is formed simultaneously with an N-type extrinsic base of the PNP transistor; and wherein a P-type emitter of the PNP transistor is formed simultaneously with a P-type extrinsic base of the NPN transistor;

for each MOS transistor, forming a MOS transistor gate within the single layer of polysilicon;

for each MOS transistor, forming MOS transistor source and drain regions within the substrate; and providing surface contacts to the bipolar transistor emitters and base contacting regions and to the NOS transistor gate, source and drain regions.

2. An integrated circuit structure as claimed in claim 1 wherein the step of forming isolation rings includes the steps of etching narrow ring-shaped slots in the polysilicon layer and filling said slots with insulating oxide material.

3. An integrated circuit structure as claimed in claim 2 wherein the step of etching includes the step of etching said slots into the intrinsic base regions.

4. An integrated circuit structure as claimed in claim 3 further including the step of, after the step of etching said slots, of doping the intrinsic base regions in areas below said slot.

5. An integrated circuit structure as claimed in claim 4 wherein the step of forming self-aligned emitters includes the step of doping said inside regions of polysilicon.

6. An integrated circuit structure as claimed in claim 5 further including the step, after forming the MOS transistor source and drain regions, of forming a layer of silicide compound on said polysilicon layer.

7. An integrated circuit structure as claimed in claim 6 wherein said silicide compound includes tungsten-silicide.

8. An integrated circuit structure as claimed in claim 7 wherein said integrated circuit structure includes complementary bipolar transistors and complementary field effect transistors.

9. An integrated circuit structure including complementary bipolar NPN and PNP transistors of similar profile and approximately performance and a field effect (MOS) transistor adjacent the bipolar transistors on a common substrate comprising:
- at least one buried layer within said substrate;
- a bipolar transistor intrinsic base region buried within said substrate and having a doping concentration different from that of the substrate;
- only a single layer of polysilicon on said substrate;
- insulating isolation rings within said polysilicon layer, around the region where bipolar transistor emitters are to be formed, said rings each having an inside region and an outside region of polysilicon;
- an N-type and a P-type self-aligned bipolar transistor emitter, each emitter located within said substrate below an inside region of polysilicon of a different ring;
- an N-type bipolar transistor extrinsic base, each extrinsic base located within said substrate below an outside region of polysilicon of a different ring;
- wherein the N-type emitter and N-type extrinsic base are formed simultaneously and the P-type emitter and P-type extrinsic base are formed simultaneously; and
- a MOS transistor gate formed within the single layer of polysilicon, and MOS source and drain regions.

10. An integrated circuit structure as claimed in claim 9 wherein the isolation ring includes a narrow ring-shaped slot which is filled with insulating oxide material.

11. An integrated circuit structure as claimed in claim 10 wherein the slot extends from a top side at the surface of the polysilicon layer to a bottom side within the intrinsic base region.

12. An integrated circuit structure as claimed in claim 11 further including a region below said slot having doped impurities.

13. An integrated circuit structure as claimed in claim 12 wherein the inside region of polysilicon has doped impurities.

14. An integrated circuit structure as claimed in claim 13 further including a layer of silicide compound on said polysilicon layer.

15. An integrated circuit structure as claimed in claim 14 wherein said layer of silicide compound includes isolated areas of silicide compound for separately providing contact areas to each of said buried layer, emitter, base contacting region and MOS gate, source and drain regions.

16. An integrated circuit structure as claimed in claim 15 wherein said silicide compound includes tungsten-silicide.

17. An integrated circuit structure including complementary bipolar NPN and PNP transistors of similar profile and approximately matched performance on a single substrate produced by the steps of:
- depositing a single layer of polysilicon on a semiconductor substrate;
- forming insulating isolation rings by direct etching within the polysilicon layer surrounding each region where an emitter is to be formed, each isolation ring having an inside and an outside region of polysilicon;
- simultaneously forming a self-aligned N-type emitter within the substrate below an inside region of polysilicon of a first ring and an N-type extrinsic base within the substrate below an outside region of polysilicon of a second ring; and
- simultaneously forming a P-type emitter within the substrate below an inside region of polysilicon of the second ring and a P-type extrinsic base within the substrate below an outside region of polysilicon of the first ring.

* * * * *

UNITED STATES PATENT AND TRADEMARK OFFICE
CERTIFICATE OF CORRECTION

PATENT NO.   : 5,444,285
DATED        : August 22, 1995
INVENTOR(S)  : Robinson et al.

It is certified that error appears in the above-identified patent and that said Letters Patent is hereby corrected as shown below:

In column 10, line 49, change "NOS" to --MOS--.

In column 11, line 12, after "approximately" insert --matched--.

In column, line 28, after "N-type" insert --and a P-type--.

Signed and Sealed this

Seventh Day of May, 1996

Attest:

BRUCE LEHMAN

*Attesting Officer*    Commissioner of Patents and Trademarks